United States Patent
Kawahara et al.

(10) Patent No.: US 7,087,495 B2
(45) Date of Patent: Aug. 8, 2006

(54) METHOD FOR MANUFACTURING SEMICONDUCTOR DEVICE

(75) Inventors: Takaaki Kawahara, Tsukuba (JP); Kazuyoshi Torii, Tsukuba (JP)

(73) Assignee: Renesas Technology Corp., Tokyo (JP)

( * ) Notice: Subject to any disclaimer, the term of this patent is extended or adjusted under 35 U.S.C. 154(b) by 160 days.

(21) Appl. No.: 10/796,978

(22) Filed: Mar. 11, 2004

(65) Prior Publication Data

US 2004/0191997 A1    Sep. 30, 2004

(30) Foreign Application Priority Data

Mar. 24, 2003    (JP) ............................. 2003-080007

(51) Int. Cl.
*H01L 21/336* (2006.01)
*H01L 21/8238* (2006.01)

(52) U.S. Cl. ...................... 438/287; 438/216; 438/591; 438/785

(58) Field of Classification Search .................. 438/679
See application file for complete search history.

(56) References Cited

U.S. PATENT DOCUMENTS 6,348,373 B1    2/2002    Ma et al.
6,884,719 B1 *  4/2005    Chang et al. ............... 438/681
2004/0175882 A1 * 9/2004   Ahn et al. .................... 438/240

OTHER PUBLICATIONS

Blin, et al., "Study of the initial steps of ALD $HfO_2$ growth on $SiO_2$", Atomic Layer Deposition (ALD) 2002, American Vacuum Society Topical Conference, Aug. 19-21, 2002, Hanyang Institute of Technology, Hanyang University, Seoul, Korea.

* cited by examiner

*Primary Examiner*—Michael Lebentritt
*Assistant Examiner*—Cheung Lee
(74) *Attorney, Agent, or Firm*—Leydig, Voit & Mayer, Ltd.

(57) ABSTRACT

A method for manufacturing a semiconductor device includes forming a first insulating film on a substrate, forming a second insulating film on the first insulating film, and forming a gate electrode on the second insulating film. Forming the second insulating film includes supplying film-forming materials and adsorbing the film-forming materials on the first insulating film, purging the film-forming materials that have not been adsorbed, supplying oxidants to oxidize the adsorbed film-forming materials, and purging the oxidants that have not contributed to oxidization. Forming the second insulating film is repeated in cycles, continuously, and the purging time of the oxidants in an initial number of the cycles is longer than the purging time of the oxidants in cycles following the initial number of cycles.

20 Claims, 4 Drawing Sheets

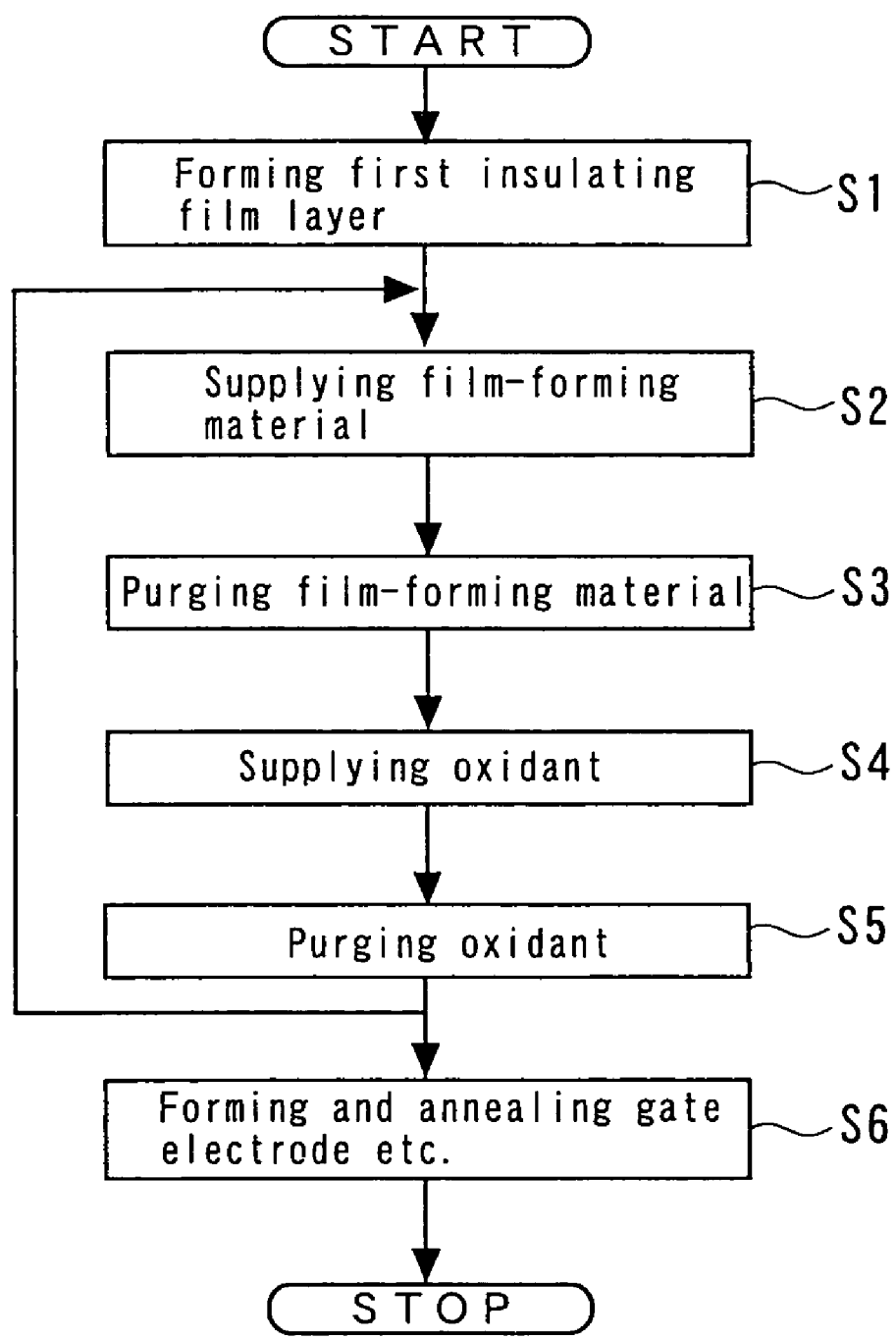

METHOD FOR MANUFACTURING SEMICONDUCTOR DEVICE

BACKGROUND OF THE INVENTION

1. Field of the Invention

The present invention relates to a method for manufacturing a semiconductor device including forming insulating gate films on a substrate.

2. Background Art

In a semiconductor device, a gate insulating film is generally formed between a gate electrode and an Si substrate to prevent tunneling current leakage The gate insulating film is generally formed of $SiO_2$.

The gate insulating film has a big problem anticipated in future CMOS (complementary metal-oxide semiconductor) scaling. Specifically, as the size of semiconductor chips is reduced, the area of the channel region is also reduced. Therefore, in order to maintain the capacitance, the $SiO_2$ film must also be thinned. However, if the thickness of the $SiO_2$ gate insulating film is reduced to 2 nm or thinner, tunnel leak current occurs. Although the tunnel leak current can be tolerated in high-performance elements if it is 3 pA or below, it will become the same as off current at 1 nA, and will exceed the tolerable value at 50 µA.

On the other hand, according to ITRS (International Technology Roadmap for Semiconductor) 2001, the equivalent oxide thickness (EOT) will be required to be 1.5 nm or less in 2006 (70-nm generation).

Therefore, on and after this generation, since the tunnel leak current will exceed the tolerable value, the $SiO_2$ film will not be able to be used as the gate insulating film. To cope with this problem, since the capacitance of an insulator is proportional to the dielectric constant, the tunneling leakage current can be suppressed if a metal oxide film (high-k material) is used as the gate insulating film to thicken the physical thickness of the gate insulating film.

However, when a metal oxide film is formed directly on an Si substrate from which a naturally formed surface oxide film has been removed by performing HF cleaning, an $SiO_2$ film is grown in the interface between the Si substrate and the metal oxide film if allowed to stand in the atmosphere, and the defect density in the interface rises and the mobility lowers. Therefore, it has been proposed first to form an $SiO_2$ film on an Si substrate, and overlay a metal oxide film on the $SiO_2$ film to form a gate insulating film.

SUMMARY OF THE INVENTION

However, when a metal oxide film is formed on an Si substrate, there is a problem of much impurities present in the vicinity of the interface between the $SiO_2$ film and the metal oxide film, or on the surface of the metal oxide film. These impurities may cause leak current and may deteriorate the mobility.

The present invention has been devised to solve the above-described problems, and the object of the present invention is to provide a method for manufacturing a semiconductor device that can reduce the quantity of impurities in the gate insulating film, lower leak current, and prevent the deterioration of the mobility.

A method for manufacturing a semiconductor device includes the steps of forming a first insulating film on a substrate, forming a second insulating film on the first insulating film, and forming a gate electrode on the second insulating film. The step of forming a second insulating film has a first step of supplying film-forming materials and making the film-forming materials adsorbed on the first insulating film, a second step of purging the film-forming materials that has not been adsorbed, a third step of supplying oxidants to oxidize the adsorbed film-forming materials, and a fourth step of purging the oxidants that has not contributed to oxidization. The step of forming a second insulating film is repeated for a plurality of cycles continuously, and the purging time in the fourth step in the initial predetermined number of cycles is made longer than the purging time in the fourth step in following cycles.

According to the present invention, as described above, the quantity of impurities in the gate insulating film can be reduced, leak current can be lowered, and the deterioration of the mobility can be prevented.

Other and further objects, features and advantages of the invention will appear more fully from the following description.

BRIEF DESCRIPTION OF THE DRAWINGS

FIG. 2 is a flow diagram for illustrating the method for manufacturing the semiconductor device of the present invention.

DETAILED DESCRIPTION OF THE PREFERRED EMBODIMENTS

First Embodiment

Figure 1:
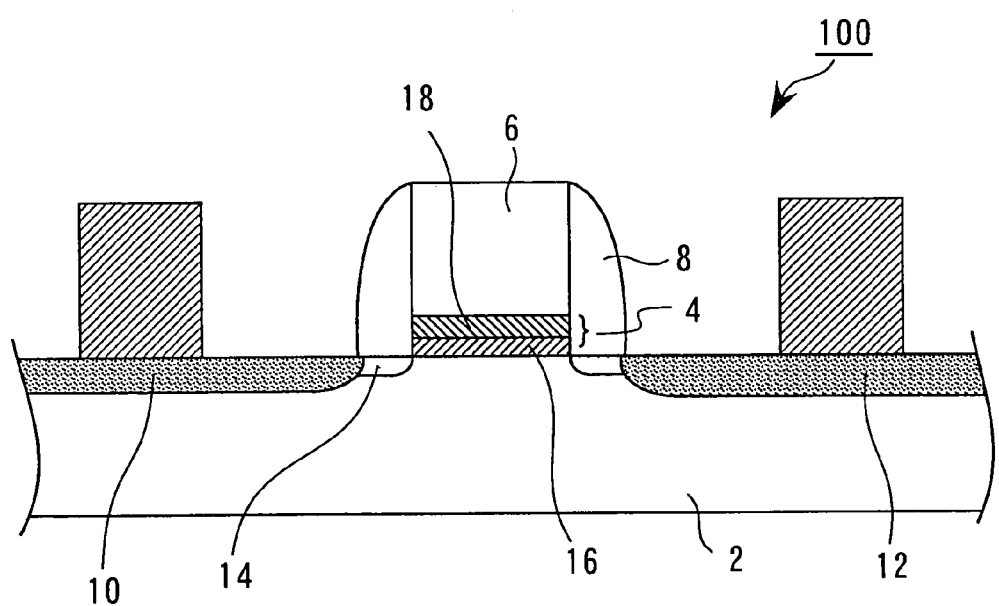
FIG. 1 is a schematic sectional view for illustrating a semiconductor device manufactured using the method for manufacturing a semiconductor device of the present invention.

FIG. 1 is a schematic sectional view for illustrating a semiconductor device 100 manufactured using the method for manufacturing a semiconductor device of the present invention. In the semiconductor device 100, as FIG. 1 shows, a gate insulating film 4 is formed on an Si substrate 2, a gate electrode 6 is formed on the gate insulating film 4, and a side walls 8 is formed on the sides of the gate insulating film 4 and the gate electrode 6.

A source region 10 and a drain region 12 are formed on the both sides of the gate insulating film 4 on the Si substrate 2. Extensions 14 are also formed inside the source region 10 and the drain region 12.

The gate insulating film 4 includes a first insulating film 16 and a second insulating film 18. The first insulating film 16 is an $SiO_2$ film formed on the Si substrate 2. The second insulating film 18 is formed on the first insulating film 16.

For example, the gate insulating film 4 (total physical film thickness of 3.6 nm), composed of the first insulating film 16 of an EOT of 0.7 nm (physical film thickness of 0.7 nm) and the second insulating film 18 of an EOT of 0.8 nm (physical film thickness of 2.9 nm, assuming the dielectric constant of 14), has an EOT of 1.5 nm, and satisfies the equation, EOT≦1.5 nm. Since the first insulating film 16 and the second insulating film 18 can sufficiently secure the physical thickness, tunnel leak current can be depressed.

FIG. 2 is a flow diagram for illustrating the method for manufacturing the semiconductor device 100 of the present invention. The method for manufacturing the semiconductor device 100 will be described below referring to FIG. 2.

First, an Si substrate is subjected to HF cleaning to remove the naturally-formed oxide film on the surface of the Si substrate 2. Then, a first insulating film 16 is formed on the Si substrate 2 (Step S1). Here, an ISSG (in-situ steam generation) film is formed as the first insulating film 16 using $H_2$ and $N_2O$.

Next, a second insulating film 18 of a desired thickness is formed by repeating the following steps S2 to S5 using ALD (atomic layer deposition) continuously. These steps are performed, for example, under the conditions of a cycle of 10.85 seconds, the growing rate of 0.52 angstroms/cycle, the temperature of the Si substrate 2 of 300° C., and the pressure in the chamber of 125 mTorr.

First, film-forming materials, $HfCl_4$, is supplied for 1.3 seconds, and a part of the film-forming materials is adsorbed on the surface of the first insulating film 16 (on and after the second cycle, the surface of the second insulating film 18 in growth) to form a monoatomic layer (Step S2). Next, the film-forming materials which has not been adsorbed on the first insulating film 16 (on and after the second cycle, the surface of the second insulating film 18 in growth) is purged for 2 seconds (Step S3). Then, water vapor ($H_2O$), which is oxidants, is supplied for 0.05 seconds to expose the surface of the Si substrate 2 to the water vapor and to oxidize $HfCl_4$ adsorbed on the first insulating film 16 (Step S4).

Then, $H_2O$ that has not contributed to oxidation is purged (Step S5). In the first predetermined number of cycles, the purging time is 90 seconds, and in the following cycles, the purging time is 7.5 seconds.

Finally, the gate electrode 6 and the like are formed and annealed (Step S6). Specifically, the gate electrode 6 and extension regions 14 are formed. Then sidewalls 8 are formed on the sides of the gate insulating film 4 and the gate electrode 6. A p-type impurity or an n-type impurity is implanted using the sidewalls 8 and the gate electrode 6 as masks to form a source region 10 and a drain region 12. Thereafter, annealing is performed at about 1000° C. to activate the source region 10 and a drain region 12.

In order to confirm the effect of the method for manufacturing a semiconductor device according to the first embodiment, the results of measuring impurities in the vicinity of the interface between the first insulating film and the second insulating film by secondary-ion mass spectroscopy (SIMS) are shown in FIG. 3. The results shown in FIGS. 3A to 3D are the results for different settings of the oxidants-purging times: FIG. 3A shows the results when the purging time was 7.5 seconds in all the cycles; FIG. 3B shows the results when the purging time was 90 seconds in all the cycles; FIG. 3C shows the results when the purging time was 90 seconds in the initial 10 cycles, and 7.5 seconds in the following cycles; and FIG. 3D shows the results when the purging time was 90 seconds in the initial 20 cycles, and 7.5 seconds in the following cycles.

Figure 3A:
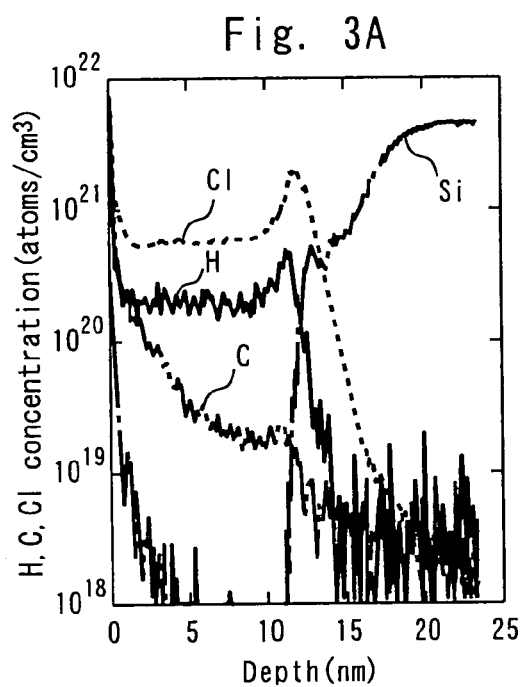
FIG. 3 shows the results of measuring impurities in the vicinity of the interface between the first insulating film and the second insulating film by secondary-ion mass spectroscopy (SIMS).

In the case of FIG. 3A, $6 \times 10^{20}$ atoms/cm$^3$ of chlorine and $2 \times 10^{20}$ atoms/cm$^3$ of hydrogen were detected. On the other hand, in the case of FIG. 3B, $2 \times 10^{20}$ atoms/cm$^3$ of chlorine and $1 \times 10^{20}$ atoms/cm$^3$ of hydrogen were detected. Therefore, increase in the oxidants-purging time can reduce the concentrations of chlorine and hydrogen to ½ to ⅓.

Figure 3B:
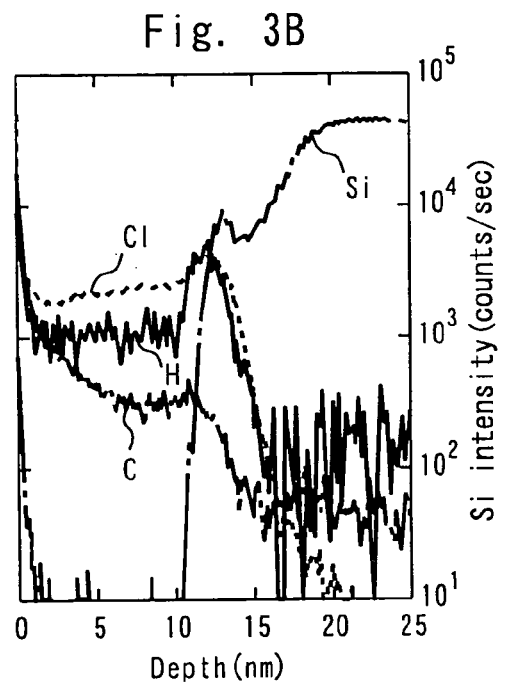
Figure 3C:
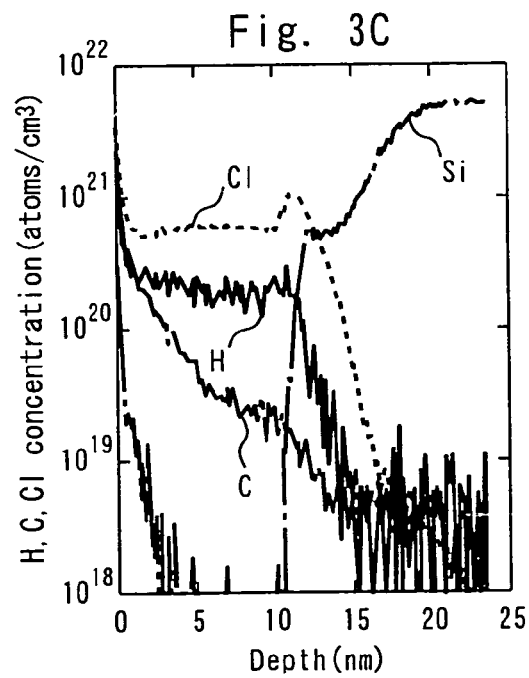
Figure 3D:
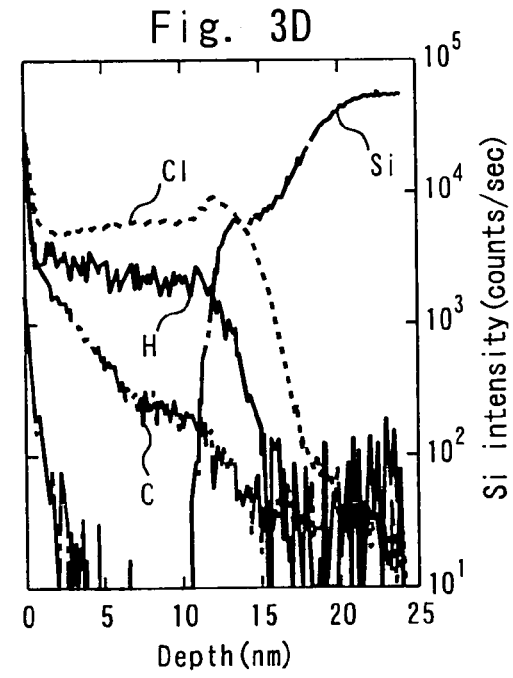

However, the case of FIG. 3B has a problem that the film forming time is excessively long. Therefore, only the oxidants-purging time in the initial predetermined number of cycles is made 90 seconds. Thereby, impurities in the vicinity of the interface between the first insulating film and the second insulating film can be sufficiently reduced without excessively increasing the film forming time as FIGS. 3C and 3D.

Figure 4:
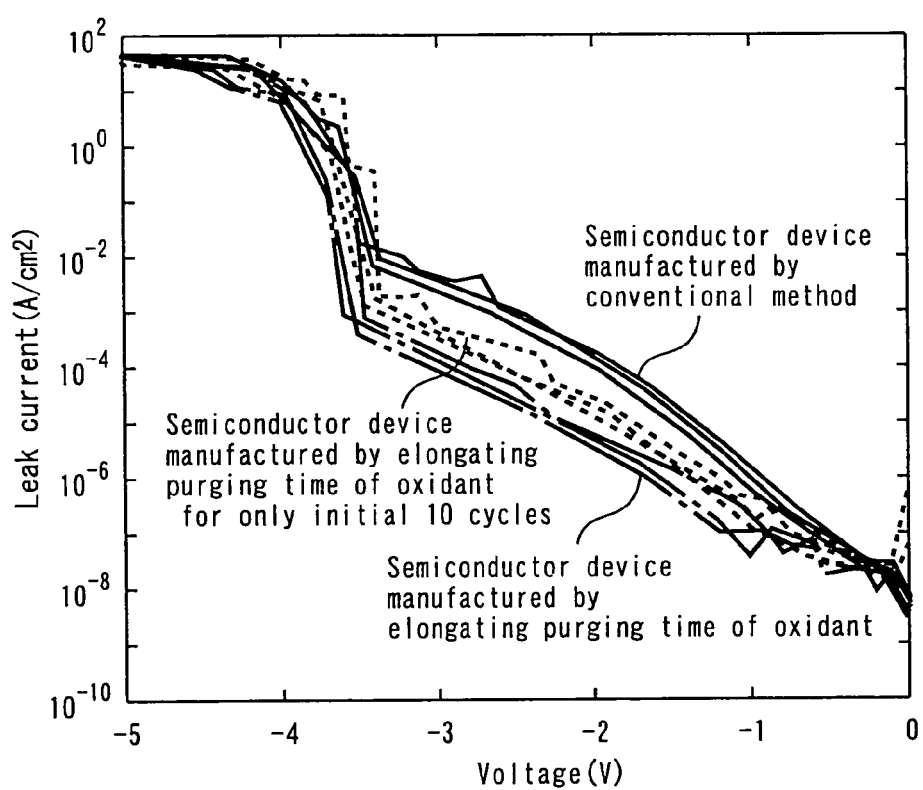
FIG. 4 shows the results of experiments conducted for examining the relationship between supply voltages and leakage currents for manufactured semiconductor device

The results of experiments conducted for examining the relationship between supply voltages and leak currents for manufactured semiconductor device are shown in FIG. 4. From the results of the experiments, it is known that leak current is larger in the semiconductor devices manufactured using a conventional method. This is because more defects are caused by impurities in the vicinity of the interface between the first insulating film and the second insulating film. On the other hand, it is shown that leak current significantly reduced in the semiconductor devices manufactured by increasing the oxidants-purging time, and even in the semiconductor devices manufactured by increasing the oxidants-purging time in only the initial 10 cycles.

In the first embodiment, as described above, the oxidants-purging time in the initial predetermined number of cycles is longer than the oxidants-purging time in the following cycles. Thereby, the supply of the film-forming materials in the state where the oxidants that has not contributed to the formation of the second insulating film remains in the chamber, and the mixing of the film-forming materials that has incompletely reacted with the oxidants before adsorbed on the second insulating film as impurities, can be prevented; the quantity of impurities in the gate insulating film can be reduced; leak current can be lowered; and the deterioration of the mobility can be prevented.

The initial predetermined number of cycles is preferably 10 to 20. This is because the above-described results shows that a sufficient effect can be expected from the cycles within this range, and the required film forming time is not so long.

It is preferable that the purging time in the above-described fourth step in the initial predetermined number of cycles is 5 to 15 times longer than the purging time in the above-described fourth step in the following cycles.

The first insulating film 16 may have an EOT of 0.7 to 1.0 nm. Then, the EOT of the second insulating film 18 is preferably 0.5 to 0.8 nm. Therefore; the specific dielectric constant of the metal oxide must be about 10 to 16 or more. In order to be used for both pMOS and nMOS, the both barrier heights of the conductor side and the valence band side must be similarly large. Therefore, as the second insulating film 18, MgO, $Sc_2O_3$, $Y_2O_3$, $La_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Lu_2O_3$, $ZrO_2$, $HfO_2$, $Al_2O_3$, or mixed crystals thereof are used.

It is especially preferable to use $HfO_2$, $HfAlO_x$, $HfSiO_x$, or any of the nitrides thereof as the second insulating film 18. However, since $HfO_2$ is crystallized to increase leak current by annealing required for the activation when the gate electrode of polysilicon is used, it can be used as the second insulating film 18 only when the gate electrode of a metal that required no activating annealing is used.

In the above-described example, an ISSG film is used as the first insulating film 16. This is because the ISSG film has a high film density. However, the first insulating film 16 is not limited thereto, but an ISSG film formed using $H_2$ and $O_2$, a chemical oxide film formed by wet oxidization, or an RTO (rapid thermal ocide) film formed by lump annealing can also be used as the first insulating film 16.

Furthermore, in the above-described example, the ALD method is used for forming the second insulating film 18. This is because the advantage of chemical adsorption can be utilized by the ALD method to grow a film having extremely homogeneous thickness and composition. However the formation of the second insulating film 18 is not limited thereto, but the CVD (chemical vapor deposition) method or the sputtering method may also be used.

An $Al_2O_3$ film may also be formed as the second insulating film 18. In this case, TMA (trimethyl aluminum: $Al(CH_3)_3$) or tris (1-methoxy-2-methyl-2-propoxy) aluminum [$Al(MMP)_3$: $Al(OC(CH_3)_2CH_2OCH_3)_3$) is used as the film-forming materials.

As the film-forming materials when an $HfO_2$ film is used as the second insulating film 18, any of hafnium tetrachloride [$HfCl_4$], tetrakis (1-methoxy-2-methyl-2-propoxy) hafnium [$Hf(MMP)_4$: $Hf(OC (CH_3)_2CH_2OCH_3)_4$], tetra tert-butoxy hafnium [$Hf (O-t-Bu)_4$: $Hf(OC(CH_3)_2)_4$], tetrakis-dimethylamino-hafnium [TDMAHf: $Hf(N(CH_3)_2)_4$], tetrakis-diethylamino-hafnium [TDEAHf: $Hf(N (C_2H_5)_2)_4$], tetrakis-methylethylamino-hafnium [TEMAHf: $Hf(N(CH_3) (C_2H_5))_4$], hafnium nitrate [$Hf(NO_3)_4$], tetrakis-dipivaloyl-methanato-hafnium [$Hf(DPM)_4$: $Hf(C_{11}H_{19}O_2)_4$], may be used.

Furthermore, a $ZrO_2$ film may be formed as the second insulating film 18. The film-forming materials in this case may be any of: zirconium tetrachloride [$ZrCl_4$], tetrakis (1-methoxy-2-methyl-2-propoxy)zirconium [$Zr (MMP)_4$: $Zr(OC(CH_3)_2CH_2OCH_3)_4$], tetra tert-butoxy zirconium [$Zr (O-t-Bu)_4$: $Zr(OC(CH_3)_2)_4$], tetrakis-dimethylamino-zirconium [TDMAZ: $Zr(N(CH_3)_2)_4$], tetrakis-diethylamino-zirconium [TDEAZ: $Zr(N(C_2H_5)_2)_4$], tetrakis-methylethylamino-zirconium [TEMAZ: $Zr(N(CH_3) (C_2H_5))_4$], zirconium nitrate [$Zr(NO_3)_4$], tetrakis-dipivaloyl-methanato-zirconium [$Zr(DPM)_4$: $Zr(C_{11},H_{19}O_2)_4$].

TMA, $H_2O$ and hafnium chloride, and $H_2O$ may also be supplied in turn to form a mixed crystal film of an $Al_2O_3$ film and an $HfO_2$ film as the second insulating film 18. In this case, the numbers of cycles for supplying the two film-forming materials and the ratio of the numbers of cycles for each material may be changed to control the film thickness and the mixing ratio.

Furthermore, in the first embodiment, water vapor ($H_2O$) is used as the oxidants. However, the oxidants is not limited thereto, but $O_2$, $O_3$, or active oxygen excited by plasma or laser may also be used.

Second Embodiment

In the first embodiment, the purging time of the oxidants in the initial predetermined number of cycles is longer than the purging time of the oxidants in the following cycles; however, alternatively, in the second embodiment, the purging time of the film-forming materials in the initial predetermined number of cycles is longer than the purging time of the film-forming materials in the following cycles. Thereby, the supply of the oxidants in the state wherein the that film-forming materials has not been adsorbed remains, and the mixing of the film-forming materials that has incompletely reacted with the oxidants as impurities, can be prevented; the quantity of impurities in the gate insulating film can be reduced; leak current can be lowered; and the deterioration of the mobility can be prevented.

According to specific experiments, when a second insulating film was formed on a first insulating film using the ALD method under the conditions of a purging time of the film-forming materials, $HfCl_4$, of 2 seconds, and a purging time of the oxidants ($H_2O$) of 7.5 seconds, as in conventional methods, $5\times10^{20}$ atoms/$cm^3$ of hydrogen and $2\times10^{21}$ atoms/$cm^3$ of chlorine were contained as impurities in the vicinity of the interface between the first insulating film and the second insulating film. Whereas in the step of forming the second insulating film 18 using the method for manufacturing a semiconductor device of the second embodiment under the conditions of a purging time of the film-forming materials, $HfCl_4$, of 30 seconds, and a purging time of the oxidants, $H_2O$, of 90 seconds, in the initial 10 cycles; and a purging time of the film-forming materials, $HfCl_4$, of 2 seconds, and a purging time of the oxidants ($H_2O$) of 7.5 seconds, in the following cycles; $\leq 2\times10^{20}$ atoms/$cm^3$ of hydrogen and $\leq 9\times10^{20}$ atoms/$cm^3$ of chlorine were contained as impurities in the vicinity of the interface between the first insulating film and the second insulating film. Therefore, it was confirmed from the experiments that the quantities of impurities in a gate insulating film could be reduced compared with conventional products when the method for manufacturing a semiconductor device of the second embodiment was used.

Here, the purging time in the above-described Step S5 in the initial predetermined number of cycles is preferably 5 to 10 times the purging time in the above-described Step S5 in the following cycles. It is also preferable to use any of $HfO_2$, $HfAlO_x$, $HfSiO_x$, or a nitride thereof as the second insulating film 18. The initial predetermined number of cycles is preferably 5 to 20.

Third Embodiment

In the first embodiment, the purging time of the oxidants in the initial predetermined number of cycles is longer than the purging time of the oxidants in the following cycles; however, in the third embodiment, the purging time of the film-forming materials in the initial predetermined number of cycles is further longer than the purging time of the film-forming materials in the following cycles. Thereby, the quantity of impurities in the gate insulating film can be further reduced, leak current can be lowered; and the deterioration of the mobility can be prevented.

Here, the purging time in the above-described Step S3 in the initial predetermined number of cycles is preferably 5 to 15 times the purging time in the above-described Step S3 in the following cycles, and the purging time in the above-described Step S5 in the initial predetermined number of cycles is preferably 5 to 10 times the purging time in the above-described Step S5 in the following cycles. It is also preferable to use any of $HfO_2$, $HfAlO_x$, $HfSiO_x$, or a nitride thereof as the second insulating film 18. The initial predetermined number of cycles is preferably 5 to 20.

Fourth Embodiment

In the first embodiment, the purging time of the oxidants in the initial predetermined number of cycles is longer than the purging time of the oxidants in the following cycles; however, alternatively, in the fourth embodiment, the supply quantity of the oxidants in Step S4 in the initial predetermined number of cycles is more than the supply quantity of the oxidants in Step S4 in the following cycles. Thereby, since the film-forming materials adhered on the first insulating film 16 (or the second insulating film 18 in growth) is surely oxidized, and the mixing of the film-forming materials that has incompletely reacted with the oxidants as impurities is prevented, the quantity of impurities in the gate insulating film can be further reduced, leak current can be lowered; and the deterioration of the mobility can be prevented.

Here, the supply quantity of the above-described oxidants in the above-described Step S4 in the initial predetermined number of cycles is preferably 2 to 3 times the supply quantity of the above-described oxidants in the above-described Step S4 in the following cycles. It is also preferable to use any of $HfO_2$, $HfAlO_x$, $HfSiO_x$, or a nitride thereof as the second insulating film 18. The initial predetermined number of cycles is preferably 5 to 20.

Fifth Embodiment

In the first embodiment, the purging time of the oxidants in the initial predetermined number of cycles is longer than the purging time of the oxidants in the following cycles; however, alternatively, in the fifth embodiment, the supply of the oxidants in Step S4 is separated into a plurality of times, and the supply quantity of the oxidants in Step S4 in the initial predetermined number of cycles is more than the supply quantity of the oxidants in Step S4 in the following cycles. Thereby, since the film-forming materials adhered on the first insulating film 16 (or the second insulating film 18 in growth) is surely oxidized, and the mixing of the film-forming materials that has incompletely reacted with the oxidants as impurities is prevented, the quantity of impurities in the gate insulating film can be further reduced, leak current can be lowered; and the deterioration of the mobility can be prevented.

Here, the number of times of supplying the above-described oxidants in the initial predetermined number of cycles is preferably 2 to 3 times the number of times of supplying the above-described oxidants in the above-described Step S4 in the following cycles. It is also preferable to use any of $HfO_2$, $HfAlO_x$, $HfSiO_x$, or a nitride thereof as the second insulating film 18. The initial predetermined number of cycles is preferably 5 to 20.

Obviously many modifications and-variations of the present invention are possible in the light of the above teachings. It is therefore to be understood that within the scope of the appended claims the invention maybe practiced otherwise than as specifically described.

The entire disclosure of a Japanese Patent Application No. 2003-080007, filed on Mar. 24, 2003 including specification, claims, drawings and summary, on which the Convention priority of the present application is based, are incorporated herein by reference in its entirety.

What is claimed is:

1. A method for manufacturing a semiconductor device comprising:
   forming a first insulating film on a substrate;
   forming a second insulating film on the first insulating film in a plurality of repeated and continuous cycles, each cycle comprising:
      supplying film-forming materials and adsorbing the film-forming materials on the first insulating film;
      purging the film-forming materials that have not been adsorbed;
      supplying oxidants to oxidize the adsorbed film-forming materials; and
      purging the oxidants that have not contributed to oxidization wherein, in purging the oxidants, purging for first purging times in an initial number of the plurality of cycles, the first purging times being longer than second purging times of purging the oxidants in the cycles after the initial number of cycles; and
   forming a gate electrode on the second insulating film.

2. The method for manufacturing a semiconductor device according to claim 1, wherein the first purging times for purging the oxidants in the initial number of cycles is 5 to 15 times longer than the purging times of the oxidants in the cycles after the initial number of cycles.

3. The method for manufacturing a semiconductor device according to claim 1, wherein the second insulating film is selected from the group consisting of $HfO_2$, $HfAlO_x$, $HfSiO_x$, and nitrides thereof.

4. The method for manufacturing a semiconductor device according to claim 1, wherein the initial number of cycles is 10 to 20 cycles.

5. The method for manufacturing a semiconductor device according to claim 1, comprising supplying a larger quantity of the oxidants in the initial number of the plurality of cycles than in the cycles after the initial number of cycles.

6. The method for manufacturing a semiconductor device according to claim 5, wherein the quantity of the oxidants supplied in the initial number of cycles is 2 to 3 times larger than the quantity of the oxidants supplied in the cycles after the initial number of cycles.

7. The method for manufacturing a semiconductor device according to claim 5, wherein the second insulating film is selected from the group consisting of $HfO_2$, $HfAlO_x$, $HfSiO_x$, and nitrides thereof.

8. The method for manufacturing a semiconductor device according to claim 5, wherein the initial number of cycles is 5 to 20 cycles.

9. The method for manufacturing a semiconductor device according to claim 1, comprising supplying the oxidants in a plurality of separate cycles, in an initial number of the plurality of cycles larger in number than the number of cycles following the initial number of cycles.

10. The method for manufacturing a semiconductor device according to claim 9, wherein the number of the separate cycles of supplying the oxidants in the initial number of cycles is 2 to 3 times larger than the number of the cycles of supplying the oxidants in the cycles following the initial number of cycles.

11. The method for manufacturing a semiconductor device according to claim 9, wherein the second insulating film is selected from the group consisting of $HfO_2$, $HfAlO_x$, $HfSiO_x$, and nitrides thereof.

12. The method for manufacturing a semiconductor device according to claim 9, wherein the initial number of cycles is 5 to 20 cycles.

13. A method for manufacturing a semiconductor device comprising:
   forming a first insulating film on a substrate;
   forming a second insulating film on the first insulating film in a plurality of repeated and continuous cycles, each cycle comprising:
      supplying film-forming materials and adsorbing the film-forming materials on the first insulating film;
      purging the film-forming materials that have not been adsorbed;
      supplying oxidants to oxidize the adsorbed film-forming materials; and
      purging the oxidants that have not contributed to oxidization wherein, in purging the film-forming materials, purging for first purging times in an initial number of the plurality of cycles, the first purging times being longer than second purging times of purging the film-forming materials in the cycles after the initial number of cycles; and
   forming a gate electrode on the second insulating film.

14. The method for manufacturing a semiconductor device according to claim 13, wherein the first purging times for purging the film-forming materials in the initial number of cycles is 5 to 10 times longer than the second purging times of the film-forming materials in the cycles after the initial number of cycles.

15. The method for manufacturing a semiconductor device according to claim 13, wherein the second insulating film is selected from the group consisting of $HfO_2$, $HfAlO_x$, $HfSiO_x$, and nitrides thereof.

16. The method for manufacturing a semiconductor device according to claim 13, wherein the initial number of cycles is 5 to 20 cycles.

17. A method for manufacturing a semiconductor device comprising:
   forming a first insulating film on a substrate;
   forming a second insulating film on the first insulating film in a plurality of repeated and continuous cycles, each cycle comprising:
      supplying film-forming materials and adsorbing the film-forming materials on the first insulating film;
      purging the film-forming materials that have not been adsorbed;
      supplying oxidants to oxidize the adsorbed film-forming materials; and
      purging the oxidants that have not contributed to oxidization wherein,
         in purging the film-forming materials, purging for first purging times in an initial number of the plurality of cycles, the first purging times being longer than second purging times of purging the film-forming materials in the cycles after the initial number of cycles, and
         in purging the oxidants, purging for third purging times in the initial number of the plurality of cycles, the third purging times being longer than fourth purging times of purging the oxidants in the cycles after the initial number of cycles; and
   forming a gate electrode on the second insulating film.

18. The method for manufacturing a semiconductor device according to claim 17, wherein
   the third purging times of the oxidants in the initial number of cycles is 5 to 15 times longer than the fourth purging times of the oxidants in the cycles after the initial number of cycles; and
   the first purging times of the film-forming materials in the initial number of cycles is 5 to 10 times longer than the second purging times of the film-forming materials in the cycles after the initial number of cycles.

19. The method for manufacturing a semiconductor device according to claim 17, wherein the second insulating film is selected from the group consisting of $HfO_2$, $HfAlO_x$, $HfSiO_x$, and nitrides thereof.

20. The method for manufacturing a semiconductor device according to claim 17, wherein the initial number of cycles is 10 to 20 cycles.

* * * * *